(12) United States Patent
Freytag

(10) Patent No.: US 10,310,034 B2
(45) Date of Patent: Jun. 4, 2019

(54) NMR TRANSMITTING/RECEIVING COIL CONFIGURATION

(71) Applicant: Bruker BioSpin AG, Faellanden (CH)

(72) Inventor: Nicolas Freytag, Binz (CH)

(73) Assignee: Bruker BioSpin AG, Faellanden (CH)

(*) Notice: Subject to any disclaimer, the term of this patent is extended or adjusted under 35 U.S.C. 154(b) by 454 days.

(21) Appl. No.: 15/091,592

(22) Filed: Apr. 6, 2016

(65) Prior Publication Data

US 2016/0306018 A1 Oct. 20, 2016

(30) Foreign Application Priority Data

Apr. 15, 2015 (DE) .......................... 10 2015 206 788

(51) Int. Cl.
| | |
|---|---|
| *G01R 33/36* | (2006.01) |
| *G01R 33/343* | (2006.01) |
| *G01R 33/34* | (2006.01) |
| *G01R 33/422* | (2006.01) |
| *G01R 33/565* | (2006.01) |

(52) U.S. Cl.
CPC ....... *G01R 33/3628* (2013.01); *G01R 33/343* (2013.01); *G01R 33/34046* (2013.01); *G01R 33/34092* (2013.01); *G01R 33/34069* (2013.01); *G01R 33/3635* (2013.01); *G01R 33/422* (2013.01); *G01R 33/5659* (2013.01)

(58) Field of Classification Search
None
See application file for complete search history.

(56) References Cited

U.S. PATENT DOCUMENTS

| | | | |
|---|---|---|---|
| 4,721,915 A | 1/1988 | Kestler | |
| 5,045,792 A | 9/1991 | Mehdizadeh | |
| 5,153,517 A | 10/1992 | Oppelt | |
| 5,929,639 A | 7/1999 | Doty | |
| 6,175,237 B1 | 1/2001 | Doty | |
| 6,812,703 B2 | 11/2004 | de Swiet | |
| 6,891,369 B2* | 5/2005 | Hurlimann | G01N 24/081 324/303 |
| 7,397,246 B2 | 7/2008 | Freytag | |
| 7,986,142 B2* | 7/2011 | Eberler | G01R 33/34076 324/318 |

(Continued)

FOREIGN PATENT DOCUMENTS

JP 63-153055 6/1988

*Primary Examiner* — Jermele M Hollington
(74) *Attorney, Agent, or Firm* — Paul Vincent

(57) ABSTRACT

A nuclear magnetic resonance coil configuration having at least one flat or cylindrical coil (18), through which current flows in operation, which coil generates a high-frequency magnetic $B_1$ field at the location of a sample (16) which is oriented parallel to an x-axis, and which for the purpose of connection to a tuning network is connected to at least two electrical feed lines (11), through which in-phase currents flow in operation, and which generate a high-frequency magnetic $B_2$ field in the sample (16), the orientation of which encloses an angle α with the direction of the $B_1$ field, is characterized in that the following applies for the angle α: $\alpha = 180° \pm \Delta\alpha$, where $\Delta\alpha < 90°$. In this way, a $B_1$ field profile, which is as rectangular as possible and is particularly steep on both sides, can be generated.

12 Claims, 4 Drawing Sheets

(56) References Cited

U.S. PATENT DOCUMENTS

2004/0217761 A1   11/2004  Wong
2010/0188086 A1*  7/2010   Lazar ............... G01R 33/34076
                                                        324/318
2012/0262173 A1*  10/2012  Soutome .......... G01R 33/34076
                                                        324/309
2013/0221968 A1   8/2013   Habara

* cited by examiner

Prior art

NMR TRANSMITTING/RECEIVING COIL CONFIGURATION

This application claims Paris convention priority from DE 10 2015 206 788.2, filed Apr. 15, 2015, the entire disclosure of which is hereby incorporated by reference.

BACKGROUND OF THE INVENTION

The invention relates to a nuclear magnetic resonance coil configuration having at least one flat or cylindrical coil, through which current flows in operation, which coil generates a high-frequency magnetic $B_1$ field at the location of a sample which is oriented parallel to an x-axis, and which for the purpose of connection to a tuning network is connected to at least two electrical feed lines, through which in-phase currents flow in operation, and which generate a high-frequency magnetic $B_2$ field in the sample, the orientation of which encloses an angle $\alpha$ with the direction of the $B_1$ field.

Such a configuration is disclosed in U.S. Pat. No. 7,397, 246 B2.

Multi-turn saddle coils and their feed lines are shown in U.S. Pat. No. 7,397,246 B2. U.S. Pat. No. 6,812,703 B2 shows a resonator with feed lines. Coils and resonators with feed lines are also illustrated in FIGS. 8.22, 8.26, 8.33, 8.36, 8.61, 8.68, 8.76 in "NMR Probeheads for Biophysical and Biomedical Experiments: Theoretical Principles & Practical Guidelines;" Joël Mispelter, Mihaela Lupu, André Briguet; Imperial College Press, 2006; ISBN 1860946372

Probe heads, in which, as a rule, coil configurations which consist of at least one saddle coil, at least one birdcage, Alderman-Grant or comparable resonators, are fitted, are used in the high-resolution NMR of liquids. Planar coils or resonators are also used, particularly in the field of probe heads for micro samples and also for probe heads which use high-temperature superconducting material for the transmitting and/or receiving coil configurations. In the following, coils and resonators are not explicitly differentiated, i.e. when coils 18 are being discussed, this refers to coils and/or resonators. There is no differentiation between coils on a flat or cylindrical substrate either.

These coils 18 are connected by means of feed lines 11 to a network, by means of which the coils can be tuned to one or more resonant frequencies which serve as transmitting and receiving frequencies when the probe head is in operation. FIGS. 1a, 1d, 1e and 1f show by way of example single and two-turn saddle coil configurations, a birdcage resonator and a double single-turn series coil configuration, in each case including feed lines 11, in a developed view.

In FIG. 1a, the intersection of the positive direction of the xz-plane with the development is denoted by 0° and that with the negative direction of the xz-plane by 180°. The yx-plane intersects the coil in the center and is shown schematically as section plane A-A'. The equivalent positions with regard to the coordinate system apply in the other drawings even when they are not explicitly shown or designated.

Coil configurations of this kind can be equipped with two (FIGS. 1e and 1f), with three (FIG. 1d) or with four feed lines (FIG. 1a) and the coil halves can be connected in series or parallel. The connection can be made within the coil (FIGS. 1d to 1f) or outside (FIGS. 1a and 1 d). A birdcage resonator can be designed as a high pass, low pass or band pass birdcage; the special embodiment in FIG. 1e serves merely to illustrate a resonator. A saddle coil with integrated capacitance between the conductors which is operated in self-resonant mode also constitutes a resonator. As a rule, resonators are connected to the network by means of just two feed lines as, in operation, the current is limited substantially within the resonator and no advantages are to be expected by using a multiplicity of feed lines. Particularly for resonators, it is also common to couple them inductively, wherein the coupling inductance becomes part of the resonator. Here, the feed lines to such a coupling coil are understood to be coil feed lines.

The saddle coils used as well as resonators are normally cylindrical and consist of "bar elements" 12, i.e. elements which are oriented substantially parallel to the cylinder axis, and "ring elements" 13, i.e. elements which are oriented substantially orthogonal to the cylinder axis.

Generally, the samples 16 are also cylindrical or ellipsoidal and have a cylinder or main axis. The axes of the coils and samples coincide with the z-axis of a coordinate system. The field direction of the static magnetic field is in general oriented parallel, orthogonal or at the so-called magic angle of approx. 54° to this axis.

In general, both the samples 16 and the coils are designed to be at least substantially cylindrical, wherein the conductor elements of the coils (both bar elements 12 and ring elements 13) lie on one or two radii. Only any possibly included crossing points 14 that may be included deviate from these radii. The coils can also include support elements 18 made of dielectric material. Connections between the radii can be achieved by capacitively acting elements (distributed capacitances by means of integrated plate capacitors, e.g. formed by overlapping conductor elements and the dielectric support material 18, or localized capacitances realized by discrete elements, i.e. soldered-in capacitors) or galvanic connections.

Bar elements and ring elements can also be differentiated in the case of flat (planar or biplanar) coils; in doing so, it should always be assumed that the bar elements are oriented substantially parallel to the z-axis and the ring elements substantially orthogonal thereto.

The feed lines can be connected either to the ring elements (FIG. 1a) or to the bar elements (FIG. 1e). It is also possible to connect one feed line to a ring element and a second to a bar element (FIGS. 1d and 1f).

In operation, the coils generate a high-frequency (HF) magnetic (B) field which is designated here as a $B_1$ field. A $B_1$ field is to be understood only as the part of the high-frequency magnetic field which is generated by the current through the conductors (and through any integrated capacitors) of the coil, but not by the currents through other conductors, such as the feed lines to the coil for example. In doing so, the frequency is tuned such that it corresponds substantially to the resonant frequency of the nuclear species to be detected in the given static magnetic field $B_0$.

This $B_1$ field can either be polarized linearly or circularly. In case of a circularly polarized field, at least two pairs of feed lines are required for excitation. The latter are generally designed orthogonally to one another and excite the two modes of the coil that are tuned to the same frequency. These pairs of feed lines can also be formed such that they have a common feed line, i.e. they consist of just three feed lines.

Each of these modes can be described by a linearly polarized field. This linearly polarized field has a preference direction and at least substantially a symmetry plane, to which the field in the measuring volume lies parallel. For a linearly polarized coil, this plane shall coincide with the xz-plane.

For circularly polarized coils, the plane defined by the $B_1$ field of the first linearly polarized mode shall coincide with the xz-plane. The plane defined by the second mode then generally coincides with the yz-plane. All feed lines that are used to excite a linearly polarized mode or coil with just one mode have in-phase currents. The currents in feed lines for a degenerate second linearly polarized mode of a coil operated in quadrature have a phase shift of approximately +90° or −90° to excite the first linearly polarized mode. A coil operated in quadrature can be considered as a combination of two linearly operated coils, wherein both coils have common conductor elements. Only linearly polarized coils are considered in the following, and consequently we will also only consider feed lines to a coil or resonator which all have the same phase. Feed lines to different coils (and therefore also different modes of one and the same coil) are explicitly not considered. Currents which flow "upwards" in one feed line and "downwards" in a second are to be considered as being in-phase.

A coil consists of a central region 21, in which the highest $B_1$ field amplitudes are achieved, and a top 22 and bottom 23 edge region, in which the $B_1$ field decreases and its magnitude tends to 0 with or without a zero crossing. If a zero crossing is present, the coils have a local maximum 24 in the edge region. The bottom region is understood to mean that region in the vicinity of which the feed lines are fitted or in the direction of which the feed lines are fed regardless of how this direction is effectively oriented in space. The top region is understood to be the edge region without feed lines. Coils also exist in which feed lines are fitted on both sides. In this case, this coil has only bottom regions and has no top edge region. In the latter case, the positive direction of the z-axis can be chosen at will, otherwise the positive z-direction must point in the direction of the top edge regions.

In the known prior art, the feed lines are normally fitted in each case as pairs of two feed lines at the same end of the coil and then fed downwards substantially parallel to the cylinder axis. The pairs of feed lines are usually either designed such that they lie symmetrically with respect to the xz-plane (FIGS. 1a, 1e) or orthogonal thereto (FIGS. 1d, 1f), i.e. symmetrical with respect to the yz-plane. The latter is particularly common when the two coil halves are connected in series.

When the number of feed lines is odd, two feed lines are usually connected to one another outside the coil so that, in operation, the magnitude, for example, of the current in one feed line is equal to the sum of the currents through two feed lines. If the connection is made capacitively and not galvanically, static modes of the coil can be suppressed. If the connection is realized by means of stop filters, couplings with further coils can be reduced. As two feed lines effectively work in the same way as one single, feed lines connected in this way shall also be understood to be "pairs of feed lines".

The feed lines can be galvanically connected to the coil (FIGS. 1a, 1d, 1f). A capacitive coupling 15 (FIG. 1e) or an inductive coupling is also common in the prior art, particularly in the case of resonators.

When the sample is changed, frequency tuning and impedance matching must be adapted to suit the sample, as the measurement substances and solvents generally have different dielectric constants and losses which change the resonant frequency and impedance of the coil. This change must be corrected by the network.

The simplest tuning variant is a variable capacitor which is connected in parallel with the inductance by means of a pair of feed lines. In doing so, it is most efficient when this inductance constitutes the greatest part of the inductance of the coil. The simplest matching variant is likewise realized by a single variable capacitor which either connects an input port to the network or an input port to ground, such that the port impedance is transformed up or down and matched to the impedance which is applied to the coil feed lines. Alternative forms of impedance and frequency matching include inductances with variable coupling, transmission lines, transformers, capacitive bridges and also couplers such as, for example, quadrature hybrids or rat race or transmission lines as well as their equivalent circuits created by discrete elements.

The effect of a different circuit on the magnetic fields generated by the coil configurations and feed lines is substantially independent of the specific design. The objective with all variants is usually to generate equal and opposite currents and potentials in a pair of feed lines, and therefore the impedances at the measuring frequency or frequencies at the feed lines for different network variants are substantially identical or at least very similar.

In the case of multi-nuclear circuits, it is no trivial matter for all resonant frequencies to achieve the requirement of equal and opposite potentials at the feed lines. Discrepancies between different networks can therefore occur. However, as long as the resonant frequencies are significantly below the Eigen-resonances of the coils used, it can be assumed that the magnitudes of the currents through the feed lines are substantially identical. If the Eigen-resonances are near or even below the operating frequency, it must be ensured that the potentials are adjusted such that the coil can be operated as efficiently as possible. This can be achieved by positioning, the current zeros in operation as far as possible in the feed lines or inside the coil as symmetrically as possible and as close as possible to the feed lines so as to result in a reduction of the $B_1$ field in the sample which is as small as possible.

As a result of changing the tuning and matching elements (generally capacitors or inductances), different currents through the feed lines occur in operation with different samples, which, with nearly all variants of coils/resonators, have a great influence on the flanks of the magnetic field profile of the coils in the test volume. This applies particularly in the case of resonators or coils which are operated close to their Eigen-resonance so that, in operation, the current through the feed lines has a significantly smaller magnitude than the current in the coil configuration.

One objective in the design of a probe head is to generate a high-frequency $B_1$ field profile in the sample which is as rectangular as possible. In particular, signals from regions of the sample which are far away from the central region must be prevented from being detected. The reason for this is that the resolution of an NMR measurement depends on the achievable static $B_0$ magnetic field homogeneity in the measuring volume. The larger this volume the harder it is to achieve a sufficient homogeneity. Particularly problematic is a "flat" HF magnetic field profile for the case of solvent suppression: as shimming the static field usually leads to the edge regions of the detection volume having a slightly different static magnetic field than its central region. As a result of the higher magnitude of the central region of the measured signal, prioritization takes place when shimming, which leads to deviations in the edge region, due to the limited number of available shim functions. Generally, the associated signals carry hardly any weight only with a few or even less than one percent of the total signal and lead to line broadening "at the foot" of the resonance line.

However, as a result of the varying resonant frequency in the edge regions of the samples, the solvent suppression here is insufficient. As the solvent signal can be orders of magnitude larger than the signal of the test substance, the measured spectra have artifacts or broad regions of poorly suppressed solvent signal when a too strong (and frequency-shifted) signal is picked from the edge regions.

FIG. 2a shows a typical magnitude profile of the HF magnetic field of a saddle coil on a log-lin scale. At the top end a zero crossing of the field can be seen, which is masked in the bottom region by the HF magnetic field generated by the currents through the feed lines. This zero crossing comes about as the field lines of the HF magnetic field are closed in themselves. All field lines which pass through the inside of the coil, in particular also through the sample, are closed in space. Some of these field lines are closed in planes parallel to the xy-plane; others, on the other hand, are closed in the xz-plane or arbitrarily. This results in a region in the sample with "reversed" field direction, wherein, as a rule, the amplitude is approximately an order of magnitude less than the field in the center of the coil. In the top region, a limitation of the HF magnetic field to a narrow range can be achieved by skilled positioning of HF screens; in the bottom region, however, this is not possible to the same extent, as only exponential damping of the remaining fields is possible in the HF screen (see FIG. 2c).

In the prior art, the screens in the bottom region can be positioned either directly at or below the level of the bottommost ring elements. As there is no zero crossing of the B field, the slew rate cannot be greater than due to the damping in the HF screen.

The difference between top and bottom region is resolved in that the conductors of the feed lines are spaced apart from one another. This spacing can occur along the periphery (angularly) and also radially. As a result, a $B_2$ field, the orientation of which has an angle $\alpha$ with $-90°\leq\alpha\leq 90°$ with respect to the $B_1$ field of the coil in the central region, is generated between the feed lines.

Equivalent to the $B_1$ field, $B_2$ field is understood to mean the part of the high-frequency magnetic field which occurs as a result of currents through the feed lines to a coil. In order to minimize this field, in the prior art, the feed lines are brought together as closely as possible and, if possible, initially fed radially outwards and only then parallel downwards.

As a high electrical potential difference occurs between the feed lines in operation, limits are placed on the distance of feed lines with different potentials (and opposing currents). If they approach too closely, the dielectric strength of the coil reduces and therefore also the maximum achievable $B_1$ field amplitude in transmit operation. In addition, the capacitance between the feed lines increases, which is often undesirable, particularly with coils and resonators for proton or fluorine detection.

The $B_1$ and $B_2$ fields for the section planes A-A' and B-B' defined in FIG. 1a are shown in FIG. 1b. A-A' is a section plane through the central region of the coil in which the $B_1$ field amplitude reaches at least 50% of the maximum $B_1$ field amplitude in the sample. The plane A-A' shown in FIG. 1a is coincident with the xy-plane. The plane B-B' is a plane which intersects the feed lines and is placed along the z-axis below the lowest lying conductor elements of the coil, in particular in a region in which the $B_1$ field of the coil has changed direction.

By definition, within the sample 16, which here is cylindrical in shape, the field lines of the $B_1$ field are oriented substantially parallel to the x-axis (FIG. 1b, top). The orientation of the $B_1$ field is shown schematically in the top diagram in FIG. 1c as a large arrow and forms an angle of 0° with the x-axis. The field lines of the $B_1$ field are closed in themselves so that the orientation of the $B_1$ field in the B-B' plane has an angle of 180° with the x-axis (not shown).

For the embodiment of the coil according to FIG. 1a, the field lines of the $B_2$ field are, at least on average, likewise aligned parallel to the x-axis over the section B-B' through the sample while it is also significantly less homogeneous and of lower amplitude than the $B_1$ field in the central region of the coil/sample. In the bottom part of FIG. 1c, the $B_2$ field is likewise shown schematically by an arrow, the orientation of which has an angle of 0° to the x-axis.

A further example is shown in FIGS. 1f to 1h. For feed lines which are mounted in the direction of the y-axis, a $B_2$ field, which has an angle of 90° (in alternative embodiments also $-90°$) to the x-axis, occurs in the section plane B-B'. In the case of inhomogeneous fields, the mean direction of the $B_2$ field over the section of the sample in the B-B' plane must be decisive.

The present invention is based on the object of modifying a nuclear magnetic resonance coil configuration of the kind defined in the introduction with particularly simple technical means such that a high-frequency B field profile, which is as rectangular as possible and is particularly steep on both sides, can be generated, preferably for high-resolution NMR spectroscopy, particularly of liquids.

SUMMARY OF THE INVENTION

This object is achieved in a surprisingly simple and effective manner and with technical means which are easily available in that the angle $\alpha$ is chosen in that: $\alpha=180°\pm\Delta\alpha$, where $\Delta\alpha<90°$.

A coil configuration which is so designed has zero crossings in the generated high-frequency magnetic field within the sample at both edges when no HF screens are fitted. When HF screens are skillfully fitted, the coil configuration which is so designed has a nearly rectangular field profile in the sample, wherein, in particular, edge regions exist in which the residual high-frequency magnetic field is nearly zero, in particular more than an order of magnitude less than in the central region.

In operation, a coil configuration according to the invention generates in a sample a high-frequency magnetic field, which both in the top edge region and in the bottom edge region generates a zero crossing or at least a minimum with a magnitude of the HF-B field which is more than an order of magnitude less than the magnitude of the HF-B field in the central region. As a result, it is possible to position HF screens such that the HF-B field in the sample decays steeply both in the top and in the bottom edge region, and in the remaining edge region the magnitude is limited to values which are more than an order of magnitude less than in the central region. A coil configuration which is so designed enables the line form of the measured signal of a sample to be optimized by shimming with less effort than coil configurations according to the prior art, and enables solvent signals to be suppressed as efficiently as possible by means of appropriate NMR pulse sequences.

Particularly preferred are embodiments of the nuclear magnetic resonance coil configuration according to the invention in which:

$\Delta\alpha\leq 45°$, preferably $\Delta\alpha\leq 15°$. A minimum of the magnitude or even a zero crossing point or region of the high-frequency magnetic field can be achieved in the sample in the bottom edge region of the coil for values of $\Delta\alpha$, which are as small as possible. This reduces the signals from the edge regions of the sample and simplifies shimming and solvent suppression.

A class of particularly simple embodiments of the invention is distinguished in that at least two of the electrical feed lines have a crossing point. The direction of the $B_2$ field below the crossing point is inverted with respect to above. The direction of the $B_2$ field below the crossing point is therefore substantially opposed to the direction of the $B_1$ field in the central region at least for small $\Delta\alpha$.

In an alternative class of embodiments thereto, at least two of the electrical feed lines are electromagnetically coupled to ring elements in a bottom region of the coil configuration, wherein these ring elements have a crossing point. In this way, the inversion of the direction of the $B_2$ field is already achieved within the coil, thus enabling the slew rate of the high-frequency magnetic field to be maximized.

A further class of embodiments is distinguished in that at least one HF screen is provided and is positioned such that the sum of the $B_1$ and $B_2$ fields is substantially zero at least in a sub-region of the sample. A field profile of the high-frequency magnetic field which is as rectangular as possible is therefore generated and a configuration which is as simple as possible for efficient solvent suppression and efficient shimming is achieved.

Alternatively, in another class of embodiments of the invention, at least four electrical feed lines, which form at least two pairs of electrical feed lines, between which a high-frequency $B_2^i$ field is generated in the sample in operation, can be connected to the coil configuration, wherein the sum of the $B_2^i$ fields is substantially zero at least in a sub-region of the sample. A coil configuration which is so designed generates a field profile which is substantially or even completely independent of the currents through the feed lines.

Preferred are developments of this class of embodiments in which at least pairs of electrical feed lines are fitted on opposite sides of the coil configuration. This embodiment is technically simple to realize and gives rise to no restrictions of the dielectric strength, as the feed lines do not have to be positioned any closer together than for coil configurations in the prior art.

Also advantageous are embodiments of the invention in which the coil configuration comprises at least two coils which each generate a high-frequency $B_1^i$ field in operation, wherein the fields are aligned such that they enclose an angle $\beta$ between them and where the following applies for the angle $\beta$: $|\beta|<10°$ or $|\beta-180°|<10°$. For coil configurations which are so designed, it is possible to generate a field profile which is steep on both sides for at least one of the two coupled modes. This is particularly relevant for configurations with which a resonator tuned for protons is coupled to a saddle coil. Such a coil configuration enables a multiplicity of nuclei in a probe head to be tuned.

In preferred developments of these embodiments, the coil configuration has at least one HF screen so that, when operating at at least one of the measuring frequencies, the sum of the $B_1^i$ and $B_2^i$ fields is substantially zero at least in a sub-region of the sample. This embodiment enables a multiplicity of nuclei in a probe head to be tuned without having to accept any detriment to the shimming ability or solvent suppression.

These developments can be further improved in that at least one of the HF screens has openings, in particular slots. The $B_2$ field can penetrate through these slots or openings into the region of the sample, thus increasing the slew rate of the high-frequency magnetic field of the coil.

Further advantages of the invention can be seen from the description and the drawing. Likewise, according to the invention, the characteristics stated above and the characteristics explained further can in each case be applied individually in their own right or jointly in any combination. The embodiments shown and described are not to be understood as a conclusive list, but rather they have an exemplary character for illustrating the invention.

The invention is shown in the drawing and is explained in more detail with reference to exemplary embodiments. In the drawing:

BRIEF DESCRIPTION OF THE DRAWING

FIG. 1b shows the schematic course of the field lines of the $B_1$ and the $B_2$ field in the planes A-A' and B-B' respectively for an configuration according to FIG. 1a;

FIG. 1c shows the direction of the $B_1$ and the $B_2$ field in the planes A-A' and B-B' respectively for a coil configuration according to FIG. 1a;

FIG. 3a shows a schematic diagram of a first embodiment of the coil configuration according to the invention with crossing points in the feed lines;

FIG. 3b shows the schematic course of the field lines of the $B_1$ and the $B_2$ field in the planes A-A' and B-B' respectively for an configuration according to FIG. 3a;

FIG. 3c shows the direction of the $B_1$ and the $B_2$ field in the planes A-A' and B-B' respectively for a coil configuration according to FIG. 3a;

FIG. 4a shows a schematic diagram of a second embodiment of the coil configuration according to the invention with series-connected single-turn coils and two feed lines;

FIG. 4b shows the schematic course of the field lines of the $B_1$ and the $B_2$ field in the planes A-A' and B-B' respectively for an configuration according to FIG. 4a;

FIG. 4c shows the direction of the $B_1$ and the $B_2$ field in the planes A-A' and B-B' respectively for a coil configuration according to FIG. 4a;

DESCRIPTION OF THE PREFERRED EMBODIMENT

Figures 3A, 3B, 3C:
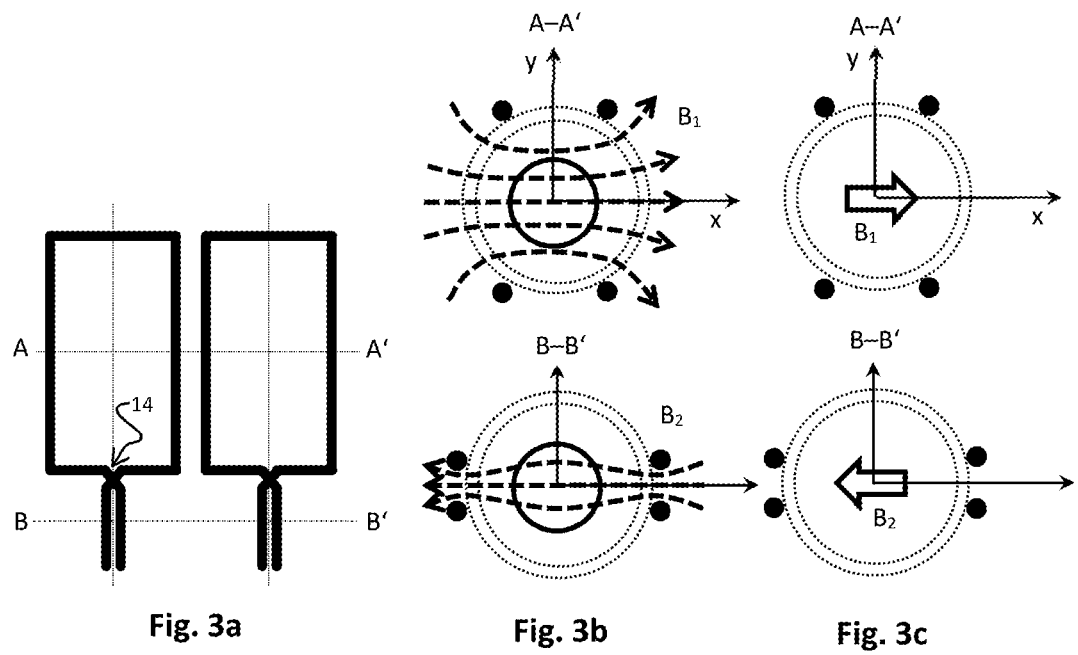

According to the invention, a $B_1$ field profile which is steep on both sides is generated in that the feed lines of the coil or the resonator have at least one crossing point in the vicinity of the bottom ring element(s). As a result of this crossing point, the orientation of the magnetic field through the feed lines is reversed so that it is opposed to the orientation of the high-frequency magnetic field in the central region of the coil. FIG. 3a shows an embodiment according to the invention of a single-turn saddle coil with four feed lines, in which the two pairs of feed lines each have a crossing point directly at the ring element. In this case too, by definition, the orientation of the $B_1$ field has an angle of 0° to the x-axis. However, in contrast to the embodiments according to the prior art, the $B_2$ field has an angle of 180° to the x-axis as shown in FIG. 3b for the plane B-B'. This is particularly clear in FIG. 3c, in which the $B_1$ and $B_2$ fields are shown schematically by arrows and have an opposing direction.

Figure 1A:
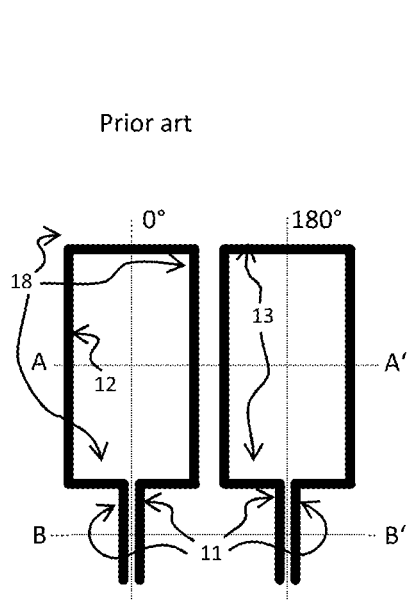
FIG. 1a shows a coil configuration with single-turn saddle coils and four feed lines in a developed view according to the prior art.
Figure 1B:
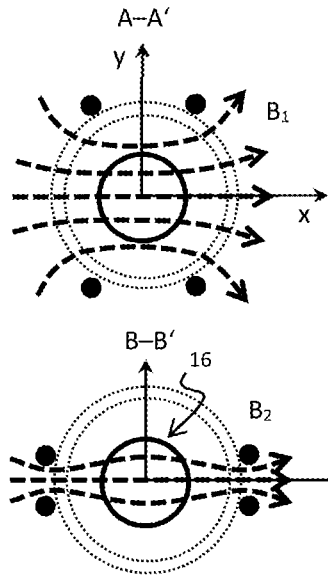
Figure 1C:
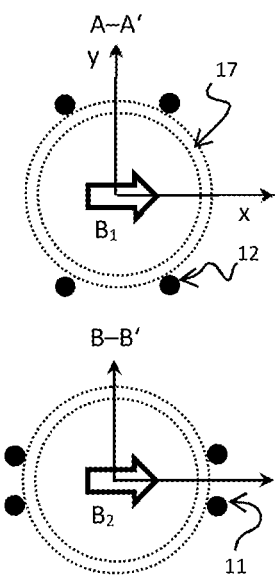
Figure 1D:
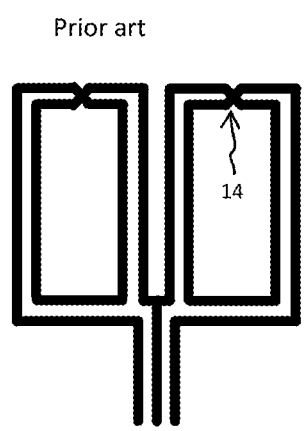
FIG. 1d shows a coil configuration with two parallel-connected two-turn saddle coils and three feed lines in a developed view according to the prior art.
Figure 1E:
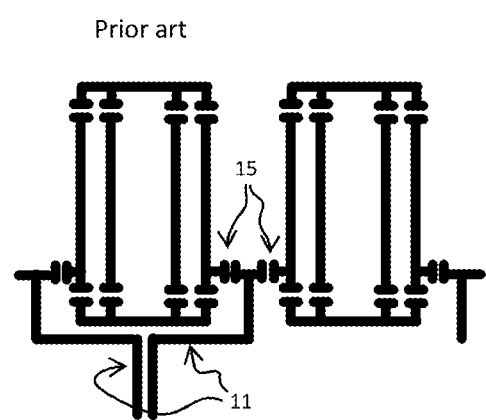
FIG. 1e shows a birdcage resonator configuration with two feed lines and capacitive coupling in a developed view according to the prior art.
Figure 1F:
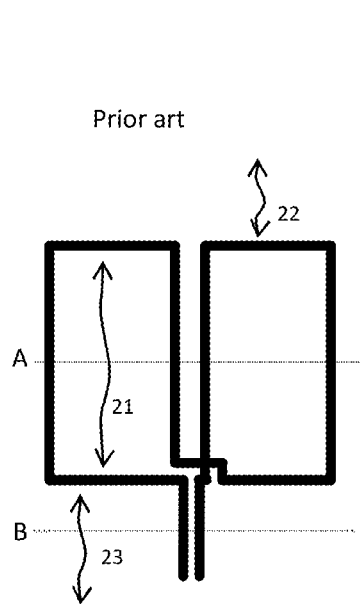
FIG. 1f shows a coil configuration with two series-connected single-turn saddle coils and two feed lines in a developed view according to the prior art.
Figure 1G:
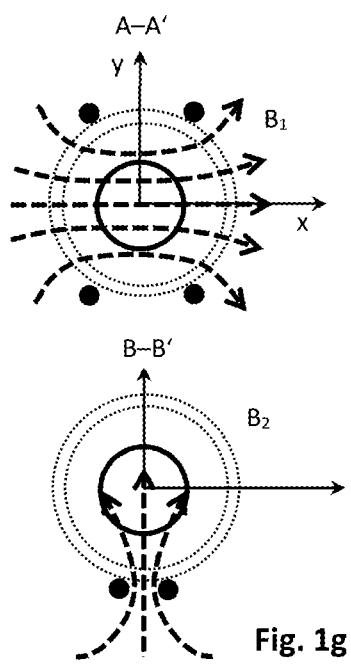
FIG. 1g shows the schematic course of the field lines of the $B_1$ and the $B_2$ field in the planes A-A' and B-B' respectively for an configuration according to FIG. 1f.
Figure 1H:
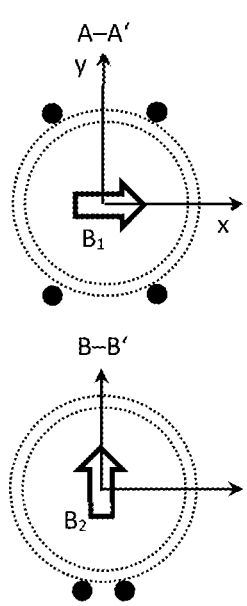
FIG. 1h shows the direction of the $B_1$ and the $B_2$ field in the planes A-A' and B-B' respectively for a coil configuration according to FIG. 1f.
Figure 2A:
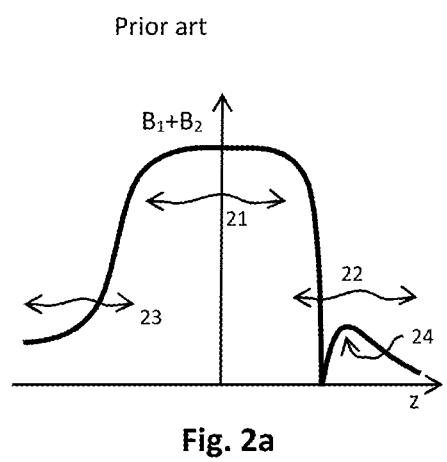
FIG. 2a shows a schematic diagram of the course of the magnetic field on a log-lin scale of the sum of the $B_1$ and $B_2$ fields for coil configurations according to the prior art.
Figure 2B:
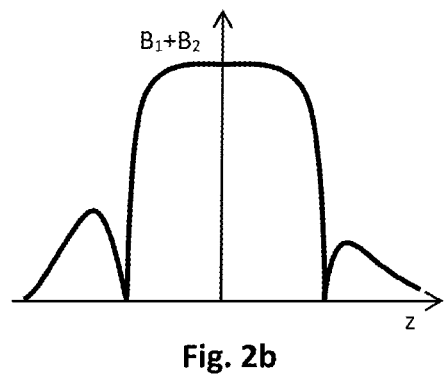
FIG. 2b shows a schematic diagram of the course of the magnetic field on a log-lin scale of the sum of the $B_1$ and $B_2$ fields for coil configurations according to the invention.
Figure 2C:
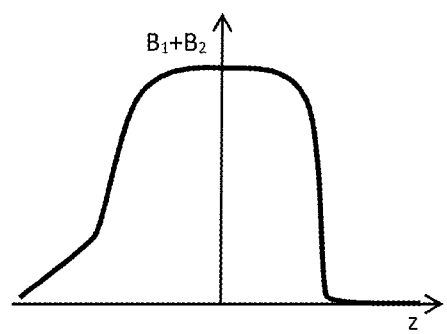
FIG. 2c shows a schematic diagram of the course of the magnetic field on a log-lin scale of the sum of the $B_1$ and $B_2$ fields for coil configurations with optimally placed HF screens according to the prior art.

When the high-frequency $B_2$ field, which is generated between the feed lines, has an angle α with 90°<α<270° to the $B_1$ field in the central region of the coil or resonator, the vectorial sum of the $B_1$ and $B_2$ fields can exhibit a zero crossing, at least however a significant reduction of the magnitude of the B field in a sub-region of the edge region instead of an increase. This is particularly efficient at an angle which is as close as possible to 180° so that an angle α with 170°<α<190° is preferred. The resulting high-frequency magnetic field profile is shown schematically in FIG. 2b. At the same time, the bottom flank of the field profile is even steeper than the top flank, as the $B_2$ field in the edge region of the profile of the $B_1$ field has already been subtracted therefrom. In contrast with this, a further sub-region of the edge region is produced, in which the B field is increased. If, additionally, screens are fitted, for a coil according to the invention, it is possible to generate a nearly rectangular B field profile both in the top region and in the bottom region, as the return flow of the B field into the volume outside the sample can be limited.

Figures 4A, 4B, 4C:
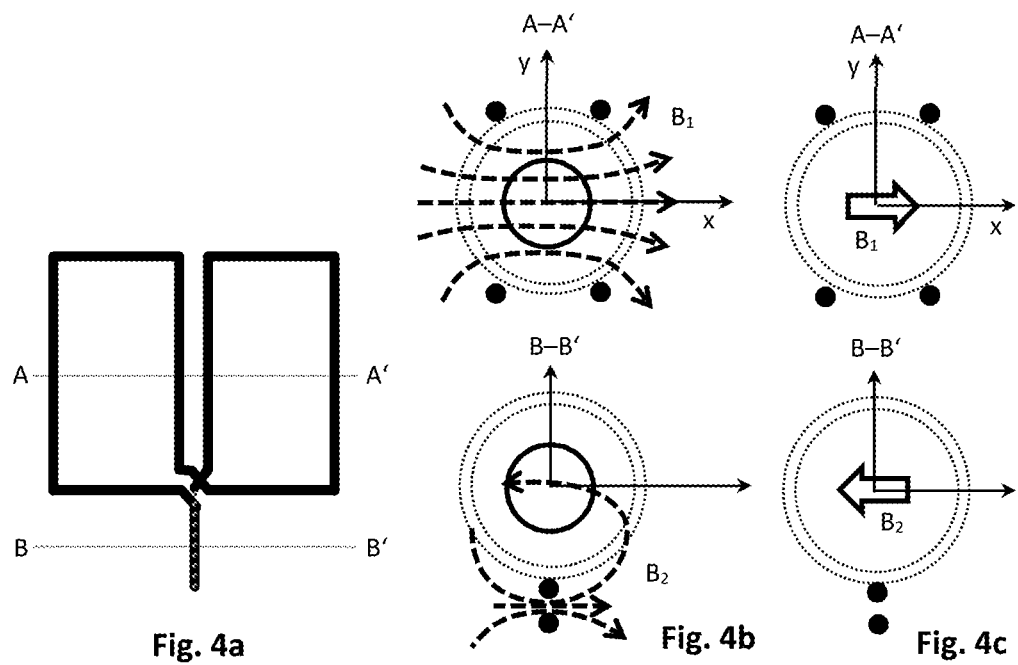

A particularly advantageous embodiment, in which the two feed lines are only spaced apart radially, is shown in FIG. 4a. In the developed diagram, the two feed lines lie above one another. The feed lines are both fitted so that they are both positioned at approximately +90° or −90° to the x-axis (see FIGS. 4b and 4c bottom). The conductors are connected such that the $B_2$ field in the sample in the plane B-B' has an angle of approximately 180° to the x-axis, as shown as field lines in FIG. 3b and schematically in FIG. 3c. This form of feed line is particularly advantageous for series-connected single and multi-turn coils. Furthermore, the magnetic coupling to a further coil, the high-frequency magnetic $B_3$ field of which is oriented along the y-axis, is reduced. Basically, any radial position can be used for fitting the feed lines when they are spaced apart in this way both radially and angularly such that the resulting $B_2$ field has an angle of ideally approximately 180° to the $B_1$ field in the central region of the coil. Particularly preferred, however, are the embodiments with only angular (FIG. 3a) or radial (FIG. 4a) spacing, as in both cases it is particularly easy to fit a further coil configuration orthogonally to the first and to electrically decouple it.

Figure 2D:
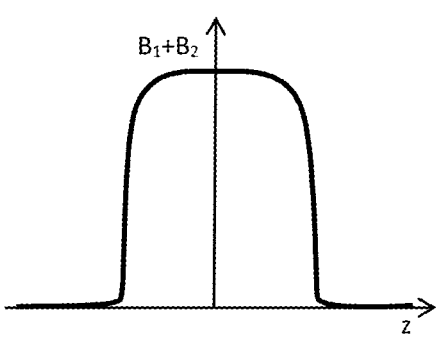
FIG. 2d shows a schematic diagram of the course of the magnetic field on a log-lin scale of the sum of the $B_1$ and $B_2$ fields for coil configurations according to the invention with optimally placed HF screens.
Figure 5:
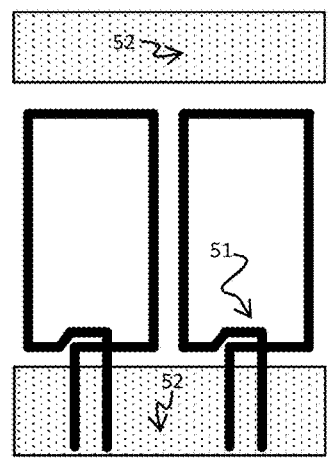
FIG. 5 shows a developed diagram of a third embodiment of the coil configuration according to the invention with crossing points within the coil.

A variant of the invention, in which the coil has a screen 52 in the top and bottom region, is shown in FIG. 5. The crossing points in the bottom region ensure a partial cancellation of the field in the bottom edge region so that the spacing of the screens at the bottom is usually different from the top. It depends on the detailed embodiment of the crossed feed lines, and in particular also the position of the crossing point, as to whether the spacing of the screens at the bottom is larger or smaller than the top. The associated B field profile (i.e. the sum of the $B_1$ and $B_2$ fields) for ideal positioning of the HF screens is shown schematically in FIG. 2d on a log-lin scale.

Figures 6A, 6B:
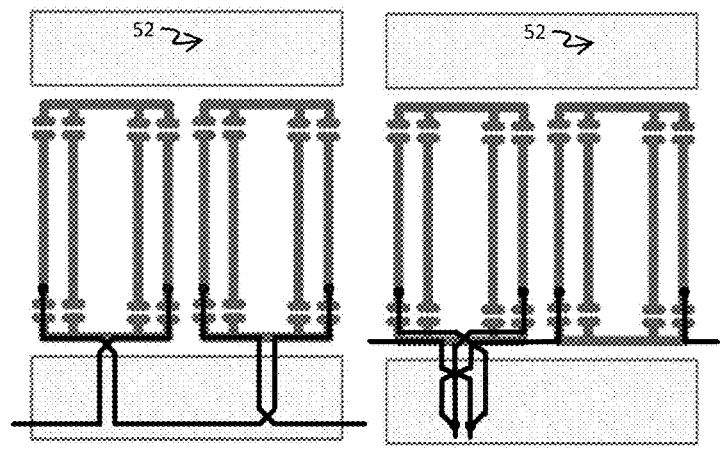
FIG. 6a shows a schematic diagram of a fourth embodiment of the coil configuration according to the invention with two pairs of feed lines of which that in the direction of the x-axis (0°) includes a crossing point and the second in the direction of the −x-axis (180°) is designed without crossing point.
FIG. 6b shows a coil configuration as in FIG. 6a, in which however both pairs of feed lines are mounted in the direction of the x-axis.

FIGS. 6a and 6b show two variants of an embodiment which is particularly advantageous, particularly when using self-resonant structures such as birdcage or Alderman-Grant resonators, for example, but also with all coils which are resonantly tuned by means of integrated capacitors. Here, the one pair of feed lines to the coil is crossed; however, a second pair is not crossed. On average, the sum of the generated fields gives approximately zero over the relevant bottom region of the sample, so that the B field profile is approximately equal to the $B_1$ field profile and is therefore independent of the current which is fed via the feed lines. A coil designed in this way can have the same B field profile over a very large tuning range. This is particularly of interest for resonators which, for example, are designed to be tunable from $^{19}F$ to $^1H$, and also for broadband probe heads which, in part, are designed to be tunable over several octaves. In addition, with this embodiment, the coupling of the feed lines to a further coil configuration which is fitted inside or encompasses the first coil configuration is greatly reduced, as the inductive coupling with the two pairs of feed lines has the opposite sign and is therefore self-cancelling as long as both pairs of feed lines are positioned symmetrically and the further coil configuration generates an substantially symmetrical high-frequency magnetic field.

With the variant shown in FIG. 6a, the crossed pair of feed lines is fixed on one side of the coil (0°), whereas the uncrossed pair of feed lines is fitted on the opposite side (i.e. at 180°). The fields of the two feed lines cancel one another at least on the axis of the cylindrical coil/resonator, otherwise they substantially cancel one another at least on average over a section through the sample orthogonal to the main axis. In alternative embodiments, the feed lines can be fitted at any angles to the x-axis.

In contrast to this, in the variant according to FIG. 6b, both the uncrossed and the crossed pair of feed lines are fitted on the same side, i.e. at approximately 0°. As a result, the fields of the two feed lines are locally superimposed and cancel one another almost completely in the sample. As the two feed lines of a pair of feed lines have a large potential difference in operation, the feed lines must be run with sufficient spacing in order to avoid electrical flashovers. These necessary spacings limit the cancellation of the fields to a certain extent.

Figure 7:
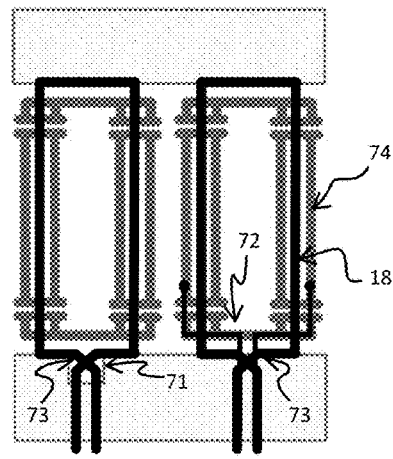
FIG. 7 shows a coil configuration consisting of a resonator and a saddle coil, wherein the feed lines of the resonator are designed without crossing point, those of the saddle coil with crossing point, and the HF screen has an opening.

FIG. 7 shows an embodiment in which the coil configuration comprises two coils/resonators which are coupled inductively to one another in that the two generated $B_1^1$ and $B_1^2$ fields lie in the same (xz-) plane. Here, the first coil is fully encompassed by the second coil. If each of the two coils is tuned to one resonant frequency, then, as a result of the coupling, this results in two modes of different frequency, with which, in operation in each case, current flows in the two coils. In doing so, in the lower mode, the current of the two coils is in the same direction (that is to say the fields add), and in the mode of higher resonant frequency, the currents in the two coils flow in the opposite direction (that is to say the fields subtract). In general, an inner coil/resonator is tuned to a higher frequency and an outer coil/resonator to a lower frequency, as in the reverse case (or when tuned to the same frequency) the common resonance of the pair of coils at the high frequency is very inefficient. If a single or multi-turn coil is combined with a resonator and the feed lines to the coil are uncrossed in accordance with the prior art then a steep $B_1+B_2$ profile and in particular an efficient suppression of the residual fields in the edge region cannot be achieved by means of screening for either of the two resonant frequencies.

This problem is solved surprisingly easily in that at least one pair of feed lines of one of the coils of the pair of coils is crossed. As a result, it is possible to adjust the sum of the $B_1^i+B_2^i$ fields for at least one of the two resonant frequencies so that they cancel one another in the edge region of the coil and generate a steep high-frequency magnetic field profile both at the top and the bottom. If, in addition, an HF screen is fitted, a high-frequency B field profile with extensive cancellation of the fields in the edge region can be achieved for at least one frequency. In FIG. 7, the feed lines 72 of the inner coil 74 are uncrossed, whereas the feed lines of the outer coil 18 encompassing it include a crossing point 73.

In order to be able to achieve an adequate magnitude of the $B_2^i$ fields through the feed lines of one or more outer coil(s) in the region of the sample, it may be necessary to make one or more openings or slots in the screen.

Positioning of the Crossing Point:

The crossing points in the pairs of feed lines can be designed such that the two conductors cross above the bottom ring elements, on the ring elements or below the ring elements. In a preferred embodiment, the crossing points lie within the coil window. As a result, a reversal of the field direction of the $B_2$ field generated by the feed lines is achieved as efficiently as possible.

In a particularly easy to realize embodiment, the crossing points are situated directly below the ring elements. As a result, additional conductor lengths are minimized and therefore the efficiency of the coils is only slightly reduced.

Comparison with Known Coils:

A type of coil, in which crossing points which reverse the field direction exist in the top and bottom region of the coil, is disclosed in U.S. Pat. No. 5,929,639 (see, for example, FIG. 3a therein). The difference compared with the present invention is that, in this case, the coil is no longer to generate a dipolar field in the test volume and the regions of reversed field are to couple as equally strongly with a second coil as the central region; i.e. the integral of the field in the "edge regions" is equal to that of the central region. As a result, the field profile is not steeper, but the field has two additional zero crossings. As in the prior art, the feed lines to these coils are fed outwards and downwards uncrossed, so that these coils effectively have three zero crossings but not four zero crossings of the $B_1$ field in the test volume.

I claim:

1. A nuclear magnetic resonance coil configuration for examination of a sample, the coil configuration comprising:
   at least one flat or cylindrical coil through which a current flows in operation, said current flow in said coil generating a $B_1$ high-frequency magnetic field at a location of the sample, wherein said $B_1$ high-frequency magnetic field is oriented parallel to an x-axis; and
   at least two electrical feed lines, said electrical feed lines being disposed, structured and dimensioned to connect said coil to a tuning network, wherein at least a fraction of said current generating said $B_1$ high-frequency magnetic field also flows through said electrical feed lines in operation, said current flow in said electrical feed lines thereby generating a B2 high-frequency magnetic field in the sample having a same phase as said $B_1$ high-frequency magnetic field, said $B_2$ high-frequency magnetic field being oriented at an angle $\alpha$ with respect to a direction of said $B_1$ high-frequency magnetic field, wherein $\alpha=180°\pm\Delta\alpha$, with $\Delta\alpha<90°$.

2. The coil configuration of claim 1, wherein $\Delta\alpha\leq 45°$.

3. The coil configuration of claim 2, wherein $\Delta\alpha\leq 15°$.

4. The coil configuration of claim 1, wherein at least two of said electrical feed lines have a crossing point.

5. The coil configuration of claim 1, further comprising ring elements disposed in a bottom region of the coil configuration, wherein at least two of said electrical feed lines are electromagnetically coupled to said ring elements, said ring elements having a crossing point.

6. The coil configuration of claim 1, further comprising at least one HF screen, said screen being disposed such that a sum of said $B_1$ and $B_2$ fields is substantially zero in at least a sub-region of the sample.

7. The coil configuration of claim 1, wherein the coil configuration comprises at least four electrical feed lines forming at least two pairs of said at least two electrical feed lines, said at least four electrical feed lines generating $B_2^i$ high-frequency fields in the sample during operation, wherein a sum of said $B_2^i$ fields is substantially zero in at least in a sub-region of the sample.

8. The coil configuration of claim 7, wherein at least pairs of electrical feed lines are fitted on opposite sides of the coil configuration.

9. The coil configuration of claim 1, wherein the coil configuration comprises at least two coils which each generate a $B_1^i$ high-frequency field in operation, said $B_1^i$ fields being aligned to enclose an angle $\beta$ between them, wherein $|\beta|<10°$ or $|\beta-180°|<10°$.

10. The coil configuration of claim 9, further comprising at least one HF screen, wherein, when operating at at least one measuring frequency, a sum of said $B_1^i$ and said $B_2$ fields is substantially zero in at least a sub-region of the sample.

11. The coil configuration of claim 10, wherein at least one said HF screen has openings.

12. The coil configuration claim 11, wherein said openings are slots.

* * * * *